(12) United States Patent
Nomoto (10) Patent No.: US 7,863,600 B2
(45) Date of Patent: Jan. 4, 2011

(54) FIELD-EFFECT TRANSISTOR

(75) Inventor: Kazumasa Nomoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 58 days.

(21) Appl. No.: 11/186,129

(22) Filed: Jul. 20, 2005

(65) Prior Publication Data

US 2006/0027860 A1 Feb. 9, 2006

(30) Foreign Application Priority Data

Aug. 4, 2004 (JP) ............... 2004-228573

(51) Int. Cl.
*H01L 35/24* (2006.01)
*H01L 51/00* (2006.01)

(52) U.S. Cl. ............... 257/40; 257/59; 257/72; 257/E51.001; 257/E51.002; 257/E51.006

(58) Field of Classification Search .......... 257/40, 257/E51.006, E51.001, E51.002
See application file for complete search history.

(56) References Cited

U.S. PATENT DOCUMENTS

| | | | |
|---|---|---|---|
| 6,335,539 B1 * | 1/2002 | Dimitrakopoulos et al. ... | 257/40 |
| 7,129,003 B2 * | 10/2006 | Cagle ................... | 429/231.8 |
| 7,230,267 B2 * | 6/2007 | Nagayama et al. ......... | 257/40 |
| 7,256,064 B2 * | 8/2007 | Hanna et al. ............ | 438/82 |
| 2003/0080426 A1 * | 5/2003 | Klauk et al. ............ | 257/744 |
| 2003/0092232 A1 * | 5/2003 | Klauk et al. ............ | 438/200 |
| 2004/0108562 A1 | 6/2004 | Nagayama et al. ......... | 257/434 |
| 2004/0161873 A1 * | 8/2004 | Dimitrakopoulos et al. ... | 438/99 |
| 2006/0249301 A1 * | 11/2006 | Meth .................... | 174/259 |
| 2006/0273303 A1 * | 12/2006 | Wu et al. ............... | 257/40 |

FOREIGN PATENT DOCUMENTS

| | | |
|---|---|---|
| JP | 2003229579 | 8/2003 |
| JP | 2004103905 | 4/2004 |
| JP | 2004-146430 | 5/2004 |

OTHER PUBLICATIONS

Japanese Office Action issued on Aug. 10, 2010 for corresponding Japanese patent application 2004-228573.

* cited by examiner

*Primary Examiner*—Kenneth A Parker
*Assistant Examiner*—Anthony Ho
(74) *Attorney, Agent, or Firm*—K&L Gates LLP

(57) ABSTRACT

A field-effect transistor is provided. The field-effect transistor includes a gate electrode, a gate-insulating layer, source/drain electrodes, and an organic semiconductor layer constituting a channel region. The source/drain electrodes each include a conductive portion composed of a metal and an organic conductive material layer which at least partially covers the conductive portion and which is doped with a dopant. The channel region is composed of the organic semiconductor layer located between the source/drain electrodes. The channel region and each of the conductive portions is electrically connected through the organic conductive material layer.

10 Claims, 9 Drawing Sheets

FIELD-EFFECT TRANSISTOR

CROSS REFERENCES TO RELATED APPLICATIONS

The present invention claims priority to Japanese Patent Application JP 2004-228573 filed in the Japanese Patent Office on Aug. 4, 2004, the entire contents of which are incorporated herein by reference.

BACKGROUND

The present invention relates to field-effect transistors (FETs), more particularly, to a field-effect transistor having a channel region composed of an organic semiconductor layer, and still more particularly, to a thin-film transistor (TFT) having a channel region composed of an organic semiconductor layer.

In the related art, in thin-film transistors (TFTs), which are one type of field-effect transistor (FET), inorganic semiconductor materials, such as Si, GaAs, and InGaAs, are used as semiconductor layers constituting channel regions. In order to produce TFTs using such inorganic semiconductor materials, high-temperature processes at 400° C. or higher are required. Therefore, it is extremely difficult to form TFTs using inorganic semiconductor materials on a soft, crack-resistant, and light base (substrate), such as a plastic substrate.

On the other hand, TFTs in which channel regions are composed of organic semiconductor layers (hereinafter referred to as "organic TFTs") can be produced at temperatures lower than the heat-resistant temperatures of plastics. Furthermore, such TFTs can be produced using coatable materials, and thus are expected to be used as inexpensive semiconductor elements suitable for application to large areas.

In organic TFTs to date, source/drain electrodes have been composed of a metal material, such as gold (Au), platinum (Pt), or palladium (Pd), so that good ohmic contacts are formed with organic semiconductor layers. Alternatively, the source/drain electrodes have been composed of poly(3,4-ethylenedioxythiophene)/polystyrene sulfonic acid [PEDOT/PSS], polyaniline doped with a dopant, or carbon nanotubes.

Gold, platinum, and palladium, which are metal materials capable of having good ohmic contact with p-type organic semiconductor layers, are expensive, and formation of source/drain electrodes and wiring by vapor deposition of such metal materials is not suitable for fabrication of low-cost organic TFTs. On the other hand, existing organic conductive material capable of forming a satisfactory ohmic contact with an organic semiconductor material have resistivities higher than those of the metal materials. Thus, such an organic conductive material is not satisfactory as a material for constituting source/drain electrodes and wiring.

An organic TFT having a structure in which source/drain electrodes composed of a metal material and an organic semiconductor layer constituting the channel region are not directly in contact with each other is disclosed, for example, in Japanese Unexamined Patent Application Publication No. 2003-229579 or 2004-103905.

In the technique disclosed in Japanese Unexamined Patent Application Publication No. 2003-229579, the source/drain electrodes each include a portion composed of a metal and a portion composed of a metal compound in contact with an organic conductive compound layer constituting the channel region. Examples of the metal compound include compounds containing metal atoms of groups 6 to 11 of the periodic table. Among these, metal compounds containing iridium, rhodium, ruthenium, platinum, gold, silver, samarium, osmium, palladium, nickel, cobalt, or europium, or a metal salt thereof are preferred. Alternatively, the metal compound may be selected from the metal complexes of these metals. (Refer to Japanese Unexamined Patent Application Publication No. 2003-229579, paragraph [0023].)

In the technique disclosed in Japanese Unexamined Patent Application Publication No. 2004-103905, a buffer layer is disposed between a source/drain electrode and an organic semiconductor layer constituting the channel region, the buffer layer being composed of a metal oxide, such as ITO, IZO, tin oxide, or zinc oxide, a nitride, an oxide, a metal, an alloy, or an organic compound. (Refer to Japanese Unexamined Patent Application Publication No. 2004-103905, paragraph [0012].)

However, with respect to the metal compounds and the buffer layer disclosed in the Japanese Unexamined Patent Application Publications described above, the range of choice with respect to the conductivity type (n-type or p-type), resistance, etc. is not sufficiently wide. That is, design freedom is restricted with respect to the materials constituting the source/drain electrodes in organic TFTs.

It is desirable to provide a field-effect transistor including source/drain electrodes which can form good ohmic contacts with an organic semiconductor layer constituting the channel region, which are not required to contain an expensive material, such as gold, platinum, or palladium, and in which the range of choice with respect to the conductivity type, resistance, etc. is sufficiently unrestricted (i.e., design freedom is sufficiently large) with respect to the material used.

SUMMARY

A field-effect transistor according to a first embodiment of the present invention includes a gate electrode, a gate-insulating layer, source/drain electrodes, and an organic semiconductor layer constituting a channel region. The source/drain electrodes each include (a) a conductive portion composed of a metal and (b) an organic conductive material layer which covers the conductive portion and which is doped with a dopant. The channel region is composed of the organic semiconductor layer located between the source/drain electrodes. The channel region and each of the conductive portions is electrically connected through the organic conductive material layer.

A field-effect transistor according to a second embodiment of the present invention is a top gate/bottom contact type thin-film transistor and includes (A) source/drain electrodes disposed on a base, (B) an organic semiconductor layer disposed on the base located between the source/drain electrodes and on the source/drain electrodes, (C) a gate-insulating layer disposed on the organic semiconductor layer, and (D) a gate electrode disposed on the gate-insulating layer. The source/drain electrodes each include (a) a conductive portion composed of a metal and (b) an organic conductive material layer doped with a dopant, the organic conductive material layer at least partially covering at least any one of the bottom surface of the conductive portion, a side surface of the conductive portion facing a side surface of the conductive portion constituting the other source/drain electrode, and the top surface of the conductive portion.

In the field-effect transistor according to the second embodiment of the present invention, the organic conductive material layer may be formed in any one of the following seven manners:
(1) on the bottom surface of the conductive portion,
(2) on a side surface (referred to as a facing side surface) of the conductive portion facing a side surface of the conductive portion constituting the other source/drain electrode,
(3) on the top surface of the conductive portion,
(4) on the bottom surface and the facing side surface of the conductive portion,
(5) on the bottom surface and the top surface of the conductive portion,
(6) on the top surface and the facing side surface of the conductive portion, and
(7) on the top surface, the facing side surface, and the bottom surface of the conductive portion.

The organic conductive material layer may be formed entirely or partially on each of the top surface, the facing side surface, or the bottom surface. Alternatively, the organic conductive material layer may be formed like an island on each of the top surface, the facing side surface, or the bottom surface.

A field-effect transistor according to a third embodiment of the present invention is a top gate/top contact type thin-film transistor and includes (A) an organic semiconductor layer disposed on a base, (B) source/drain electrodes disposed on the organic semiconductor layer, (C) a gate-insulating layer disposed on the organic semiconductor layer located between the source/drain electrodes and on the source/drain electrodes, and (D) a gate electrode disposed on the gate-insulating layer. The source/drain electrodes each include (a) a conductive portion composed of a metal and (b) an organic conductive material layer doped with a dopant, the organic conductive material layer at least partially covering at least one of the bottom surface of the conductive portion and a side surface of the conductive portion facing a side surface of the conductive portion constituting the other source/drain electrode.

In the field-effect transistor according to the third embodiment of the present invention, the organic conductive material layer may be formed in any one of the following five manners:
(1) on the bottom surface of the conductive portion,
(2) on the facing side surface of the conductive portion,
(3) on the bottom surface and the facing side surface of the conductive portion,
(4) on the top surface and the facing side surface of the conductive portion, and
(5) on the top surface, the facing side surface, and the bottom surface of the conductive portion.

The organic conductive material layer may be formed entirely or partially on each of the top surface, the facing side surface, or the bottom surface. Alternatively, the organic conductive material layer may be formed like an island on each of the top surface, the facing side surface, or the bottom surface.

A field-effect transistor according to a fourth embodiment of the present invention is a bottom gate/bottom contact type thin-film transistor and includes (A) a gate electrode disposed on a base, (B) a gate-insulating layer disposed on the gate electrode and the base, (C) source/drain electrodes disposed on the gate-insulating layer, and (D) an organic semiconductor layer disposed on the gate-insulating layer located between the source/drain electrodes and on the source/drain electrodes. The source/drain electrodes each include (a) a conductive portion composed of a metal and (b) an organic conductive material layer doped with a dopant, the organic conductive material layer at least partially covering at least any one of the bottom surface of the conductive portion, a side surface of the conductive portion facing a side surface of the conductive portion constituting the other source/drain electrode, and the top surface of the conductive portion.

In the field-effect transistor according to the fourth embodiment of the present invention, the organic conductive material layer may be formed in any one of the following seven manners:
(1) on the bottom surface of the conductive portion,
(2) on the facing side surface of the conductive portion,
(3) on the top surface of the conductive portion,
(4) on the bottom surface and the facing side surface of the conductive portion,
(5) on the bottom surface and the top surface of the conductive portion,
(6) on the top surface and the facing side surface of the conductive portion, and
(7) on the top surface, the facing side surface, and the bottom surface of the conductive Portion.

The organic conductive material layer may be formed entirely or partially on each of the top surface, the facing side surface, or the bottom surface. Alternatively, the organic conductive material layer may be formed like an island on each of the top surface, the facing side surface, or the bottom surface.

A field-effect transistor according to a fifth embodiment of the present invention is a bottom gate/top contact type thin-film transistor and includes (A) a gate electrode disposed on a base, (B) a gate-insulating layer disposed on the gate electrode and the base, (C) an organic semiconductor layer disposed on the gate-insulating layer, and (D) source/drain electrodes disposed on the organic semiconductor layer. The source/drain electrodes each include (a) a conductive portion composed of a metal and (b) an organic conductive material layer doped with a dopant, the organic conductive material layer at least partially covering at least one of the bottom surface of the conductive portion and a side surface of the conductive portion facing a side surface of the conductive portion constituting the other source/drain electrode.

In the field-effect transistor according to the fifth embodiment of the present invention, the organic conductive material layer may be formed in any one of the following five manners:
(1) on the bottom surface of the conductive portion,
(2) on the facing side surface of the conductive portion,
(3) on the bottom surface and the facing side surface of the conductive portion,
(4) on the top surface and the facing side surface of the conductive portion, and
(5) on the top surface, the facing side surface, and the bottom surface of the conductive portion.

The organic conductive material layer may be formed entirely or partially on each of the top surface, the facing side surface, or the bottom surface. Alternatively, the organic conductive material layer may be formed like an island on each of the top surface, the facing side surface, or the bottom surface.

In the field-effect transistor according to each of the second to the fifth embodiments of the present invention, preferably, the channel region is composed of the organic semiconductor layer located between the source/drain electrodes, and the channel region and the conductive portion is electrically connected through the organic conductive material layer.

In the field-effect transistor according to each of the first to the fifth embodiments of the present invention including the preferred structures described above, the material constituting the organic conductive material layer is preferably prepared by doping at least one organic material selected from the group consisting of polythiophene, polypyrrole, polyaniline, polyacetylene, polyphenylene, polyfuran, polyselenophene, polyisothianaphthene, polyphenylene sulfide, polyphenylenevinylene, polythienylenevinylene, polynaphthalene, polyanthracene, polypyrene, polyazulene, phthalocyanine, pentacene, merocyanine, and polyethylenedioxythiophene with at least one dopant such as iodine, perchloric acid, hydrochloric acid, sulfuric acid, nitric acid, phosphoric acid, tetrafluoroboric acid, arsenic pentafluoride, hexafluorophosphoric acid, alkyl sulfonic acid, perfluoroalkyl sulfonic acid, polyacrylic acid, polystyrene sulfonic acid, and dodecylbenzenesulfonic acid. As the material constituting the organic conductive material layer, one combination may be selected from the 266 combinations consisting of 19 organic materials and 14 dopants described above. In particular, preferred examples of the combination (the material constituting the organic semiconductor layer, the organic material, and the dopant), examples of the material constituting the organic semiconductor layer being described below, include (pentacene, polyethylenedioxythiophene, and polystyrene sulfonic acid), (polythiophene, polyethylenedioxythiophene, and polystyrene sulfonic acid), (polyfluorene, polyethylenedioxythiophene, and polystyrene sulfonic acid), (pentacene, polyaniline, and dodecylbenzenesulfonic acid), (polythiophene, polyaniline, and dodecylbenzenesulfonic acid), and (polyfluorene, polyaniline, and dodecylbenzenesulfonic acid). Furthermore, in such a case, carbon nanotubes and/or fullerenes may be incorporated into the material constituting the organic conductive material layer.

Preferably, the conductivity type of the organic semiconductor layer is the same as the conductivity type of the organic conductive material layer. That is, preferably, when the conductivity type of the organic semiconductor layer is n type, the conductivity type of the organic conductive material layer is n type; and when the conductivity type of the organic semiconductor layer is p type, the conductivity type of the organic conductive material layer is p type.

With respect to the doping of the material constituting the organic conductive material layer with a dopant, for example, doping may be achieved by adding the dopant to the starting materials for the material constituting the organic conductive material layer during the synthesis of the material constituting the organic conductive material layer. Alternatively, doping may be achieved by reaction between the dopant and the material constituting the organic conductive material layer. Alternatively, doping may be achieved by an electrochemical doping process in which the material constituting the organic conductive material layer is immersed in an electrolyte solution and electrochemically doped with electrolyte ions (dopant).

In the preferred embodiments of the present invention, examples of the material constituting the conductive portion include metals, such as copper (Cu), silver (Ag), aluminum (Al), chromium (Cr), nickel (Ni), molybdenum (Mo), niobium (Nb), neodymium (Nd), rubidium (Rb), rhodium (Rh), tantalum (Ta), tungsten (W), titanium (Ti), indium (In), and tin (Sn), alloys containing these metal elements, tin oxide, indium oxide, indium-tin oxide (ITO), graphite, fine gold particles, fine platinum particles, fine palladium particles, fine silver particles, and fine copper particles. A layer containing a plurality of these substances is desirable. The conductive portion may be composed of a thin film including any of these metals and alloys or composed of fine particles of any of these metals and alloys.

According to the embodiments of the present invention, examples of the method for forming the organic conductive material layer include, although depending on the material constituting the organic conductive material layer, physical vapor deposition (PVD), such as vacuum deposition and sputtering; various types of chemical vapor deposition (CVD); spin coating methods; various types of printing methods, such as screen printing, ink-jet printing, offset printing, and gravure printing; various types of coating methods, such as air-doctor coating, blade coating, rod coating, knife coating, squeeze coating, reverse roll coating, transfer roll coating, gravure coating, kiss coating, cast coating, spray coating, slit orifice coating, calender coating, and dipping methods; and spraying methods.

Examples of the method for forming the conductive portion include, although depending on the material constituting the conductive portion, PVD, such as vacuum deposition and sputtering; various types of CVD including MOCVD; spin coating methods; various types of printing methods described above using various types of conductive paste; various types of coating methods described above; lift-off methods; shadow-mask methods; and plating methods, such as electrolytic plating, electroless plating, or a combination of both. According to need, these methods may be combined with patterning techniques. Additionally, examples of PVD include (a) various types of vacuum deposition methods, such as electron beam heating, resistance heating, and flash vapor deposition; (b) plasma deposition methods; (c) various types of sputtering methods, such as diode sputtering, DC sputtering, DC magnetron sputtering, RF sputtering, magnetron sputtering, ion beam sputtering, and bias sputtering; and (d) various types of ion plating methods, such as direct current (DC) methods, RF methods, multi-cathode methods, activated reactive ion plating methods, electric field deposition, RF ion plating, and reactive ion plating.

Furthermore, the conductive portion and the organic conductive material layer may be formed simultaneously by a lift-off method. Namely, although depending on the structure of the field-effect transistor, source/drain electrodes can be produced by a method in which a resist layer provided with openings at positions for forming source/drain electrodes is formed on a base, an organic semiconductor layer, or a gate-insulating layer (referred to as "underlayer" for the sake of convenience), a layer constituting each conductive portion and an organic conductive material layer are disposed on the underlayer and the resist layer in that order, and then the resist layer, and the layer constituting the conductive portion and the organic conductive material layer disposed thereon are removed. Herein, by subjecting the resist layer to surface treatment after the resist layer provided with openings at the positions for forming the source/drain electrodes has been formed on the underlayer, by forming the resist layer in a two-layer structure, or by forming a resist layer composed of a negative resist, it is possible to set the size of the upper portion of each opening larger than the size of the lower portion. Consequently, by optimizing the conditions for forming the conductive portion and the conditions for forming the organic conductive material layer, it is possible to form the organic conductive material layer on the facing side surface of the conductive portion by the lift-off method.

Figures 7A, 7B, 7C, 7D:
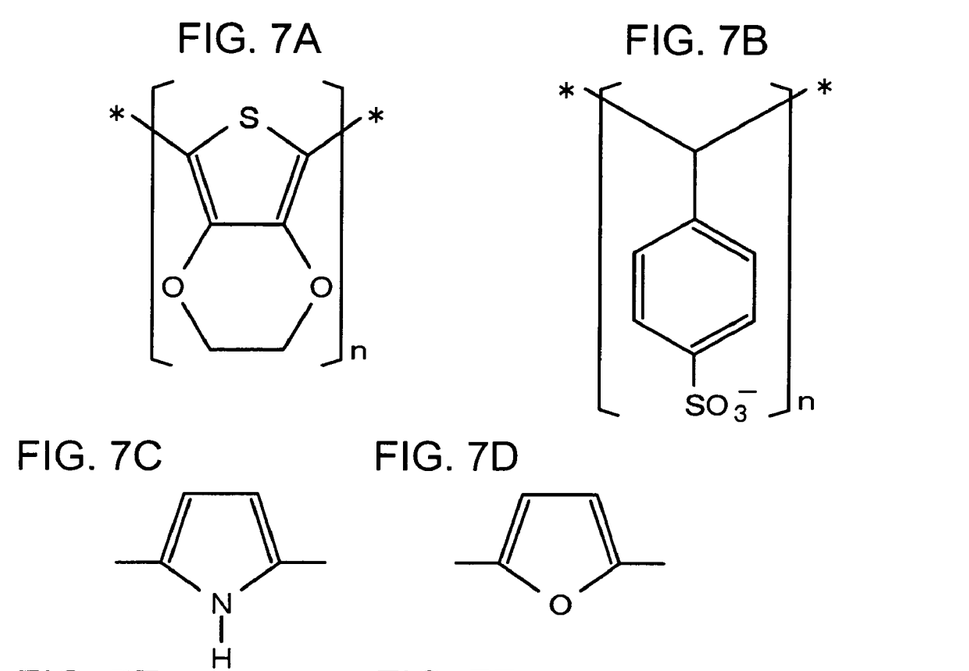
FIGS. 7A, 7B, 7C, 7D, 7E, 7F, 7G, 7H and 7I each show a structural formula of an organic semiconductor material suitable for use in embodiments of the present invention.

According to the embodiments of the present invention, examples of the material constituting the organic semiconductor layer, which may be used, include 2,3,6,7-dibenzanthracene (also referred to as "pentacene"), $C_9S_9$ (benz[1,2-c; 3,4-c';5,6-c"]tris[1,2]dithiol-1,4,7-trithione), $C_{24}H_{14}S_6$ (alpha-sexithiophene), phthalocyanines such as copper phthalocyanine, fullerenes ($C_{60}$), tetrathiotetracene ($C_{18}H_8S_4$), tetraselenotetracene ($C_{18}H_8Se_4$), tetratellurotetracene ($C_{18}H_8Te_4$), poly(3-hexylthiophene), polyfluorene ($C_{13}H_{10}$) and poly(3,4-ethylenedioxythiophene)/polystyrene sulfonic acid [PEDOT/PSS]. FIG. 7A shows the structural formula of poly(3,4-ethylenedioxythiophene), and FIG. 7B shows the structural formula of polystyrene sulfonic acid.

Alternatively, as the organic semiconductor layer, for example, a heterocyclic conjugated conductive polymer or a heteroatom-containing conjugated conductive polymer, of which examples will be described below, may be used. In the structural formulae, R and R' each represent an alkyl group ($C_nH_{2n+1}$).

[Heterocyclic Conjugated Conductive Polymers]

Polypyrrole [Refer to the structural formula shown in FIG. 7C.]

Polyfuran [Refer to the structural formula shown in FIG. 7D.]

Figure 7E:
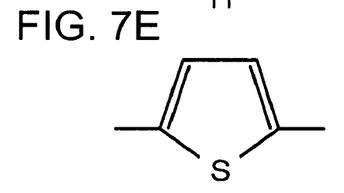

Polythiophene [Refer to the structural formula shown in FIG. 7E.]

Figure 7F:
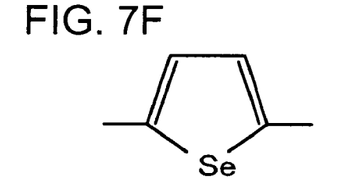

Polyselenophene [Refer to the structural formula shown in FIG. 7F.]

Figure 7G:
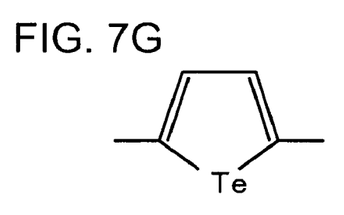

Polytellurophene [Refer to the structural formula shown in FIG. 7G.]

Figure 7H:
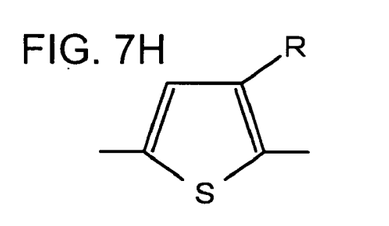

Poly(3-alkylthiophene) [Refer to the structural formula shown in FIG. 7H.]

Figure 7I:
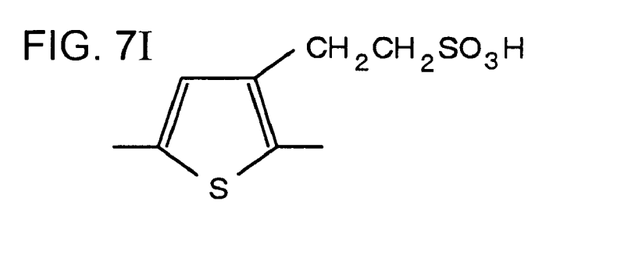

Poly(3-thiophene-β-ethanesulfonic acid) [Refer to the structural formula shown in FIG. 7I.]

Figure 8A:
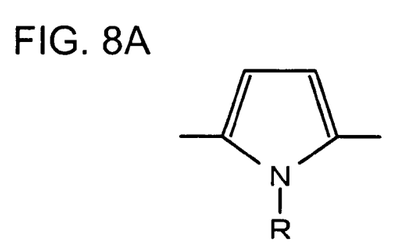
FIGS. 8A, 8B, 8C, 8D, 8E, and 8F each show a structural formula of an organic semiconductor material suitable for use in embodiments of the present invention.

Poly(N-alkylpyrrole) [Refer to the structural formula shown in FIG. 8A.]

Figure 8B:
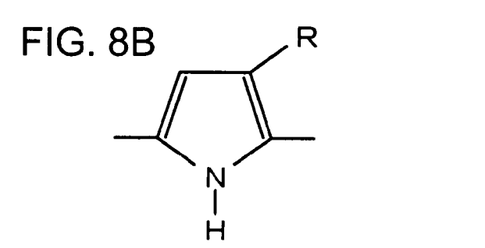

Poly(3-alkylpyrrole) [Refer to the structural formula shown in FIG. 8B.]

Figure 8C:
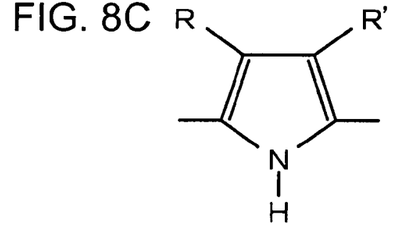

Poly(3,4-dialkylpyrrole) [Refer to the structural formula shown in FIG. 8C.]

Figure 8D:
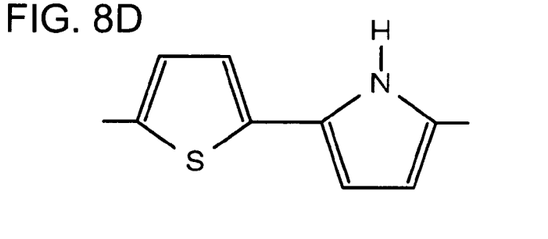

Poly(2,2'-thienylpyrrole) [Refer to the structural formula shown in FIG. 8D.]

[Heteroatom-Containing Conjugated Conductive Polymers]

Figure 8E:
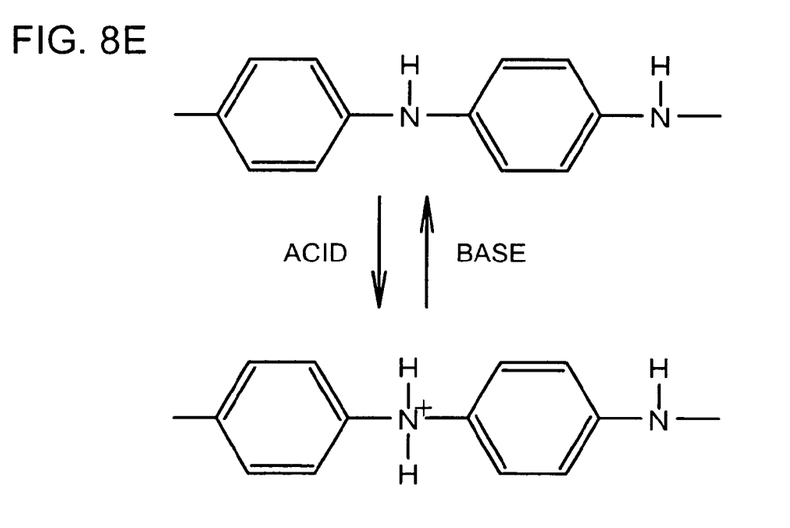

Polyaniline [Refer to the structural formula shown in FIG. 8E.]

Figure 8F:
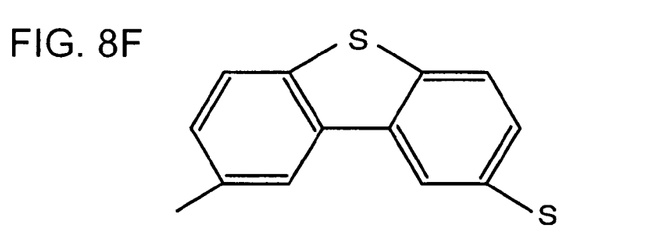

Poly(dibenzothiophene sulfide) [Refer to the structural formula shown in FIG. 8F.]

Figure 9A:
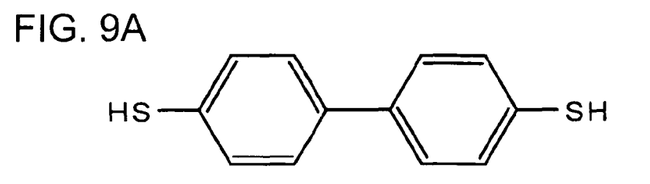
FIGS. 9A, 9B, 9C, and 9D each show a structural formula of an organic semiconductor material suitable for use in embodiments of the present invention.

Alternatively, preferably, the organic semiconductor molecule constituting the organic semiconductor layer is a conjugated bond-containing organic semiconductor molecule having at both ends thiol groups (—SH), amino groups (—NH2), isocyano groups (—NC), thioacetoxyl groups (—SCOCH3), or carboxyl groups (—COOH). Specific examples of such an organic semiconductor molecule include the followings:

4,4'-biphenyldithiol [Refer to the structural formula shown in FIG. 9A.]

Figure 9B:
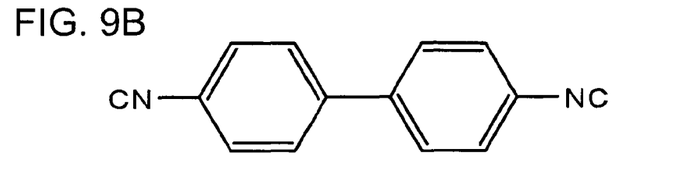

4,4'-diisocyanobiphenyl [Refer to the structural formula shown in FIG. 9B.]

Figure 9C:
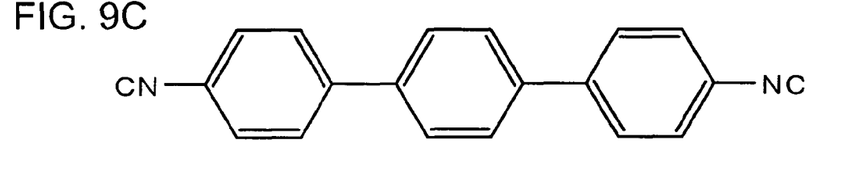

4,4'-diisocyano-p-terphenyl [Refer to the structural formula shown in FIG. 9C.]

Figure 9D:
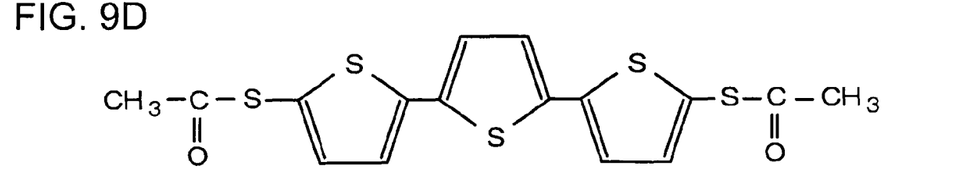

2,5-bis(5'-thioaceoxyl-2'-thiophenyl)thiophene [Refer to the structural formula shown in FIG. 9D.]

Examples of the method for forming the organic semiconductor layer include, although depending on the material constituting the organic semiconductor layer, the same methods as those described with respect to the method for forming the organic conductive material layer.

Examples of the material constituting the gate electrode include metals, such as chromium (Cr), nickel (Ni), molybdenum (Mo), niobium (Nb), neodymium (Nd), rubidium (Rb), rhodium (Rh), aluminum (Al), silver (Ag), tantalum (Ta), tungsten (W), titanium (Ti), copper (Cu), indium (In), and tin (Sn), alloys containing these metal elements, conductive particles composed of these metals, conductive particles composed of alloys containing these metals, tin oxide, indium oxide, and indium-tin oxide (ITO). Layers containing these elements may be stacked for forming the gate electrode. Furthermore, as the material for constituting the gate electrode, an organic material, such as poly(3,4-ethylenedioxythiophene)/polystyrene sulfonic acid [PEDOT/PSS], may be mentioned.

Examples of the method for forming the gate electrode include, although depending on the material constituting the gate electrode, the same methods as those described with respect to the method for forming the conductive portion, and spraying methods.

Examples of the material constituting the gate-insulating layer include inorganic insulating materials, such as silicon oxide-based materials, silicon nitride ($SiN_y$), $Al_2O_3$, $HfO_2$, and high dielectric metal oxide films; and organic insulating materials, such as polymethyl methacrylate (PMMA), polyvinyl phenol (PVP), polyvinyl alcohol (PVA), polyethylene terephthalate (PET), polyoxymethylene (POM), polyvinyl chloride, polyvinylidene fluoride, polysulfone, polycarbonate (PC), and polyimide. These materials may be used in combination. Examples of the silicon oxide-based materials include silicon dioxide ($SiO_x$), BPSG, PSG, BSG, AsSG, PbSG, silicon oxynitride (SiON), spin on glass (SOG), and low dielectric constant $SiO_2$-based materials (e.g., polyaryl ethers, cycloperfluoro carbon polymers, benzocyclobutene, cyclic fluorocarbon resins, polytetrafluoroethylene, fluoroaryl ethers, polyfluoroimide, amorphous carbon, and organic SOG). The gate-insulating layer may be formed, for example, by any method selected from the group consisting of PVD, such as vacuum deposition and sputtering; various types of CVD; spin coating methods; various types of printing methods described above; various types of coating methods described above; dipping methods; casting methods; and spraying methods.

Examples of the base include various types of glass substrates, various types of glass substrates provided with insulating layers on the surfaces thereof, quartz substrates, quartz substrates provided with insulating layers on the surfaces thereof, and silicon substrates provided with insulating layers on the surfaces thereof. Other examples of the base include plastic films, plastic sheets, and plastic substrates composed of polymeric materials, such as polyether sulfone (PES), polyimide, polycarbonate (PC), polyethylene terephthalate (PET), polymethyl methacrylate (PMMA), polyvinyl alcohol (PVA), and polyvinyl phenol (PVP). By using a base composed of any one of such flexible polymeric materials, for example, the resulting field-effect transistor can be built in or integrated into a display device or an electronic apparatus having curved surfaces. Furthermore, as the base, for example, a conductive substrate (i.e., a substrate composed of a metal, such as gold, or highly oriented graphite) may also be used. Depending on the configuration and structure of the field-effect transistor, the field-effect transistor is provided on a supporting member. Such a supporting member can also be composed of any of the materials described above. Furthermore, the electronic apparatus and the field-effect transistor may be sealed with resins.

When the field-effect transistors according to the embodiments of the present invention are applied to or used for display devices or various types of electronic apparatuses, monolithic integrated circuits in which many field-effect transistors are integrated on bases may be fabricated, or the individual field-effect transistors may be separated by cutting to produce discrete components. Alternatively, the field-effect transistors may be sealed with resins.

In accordance with any of the embodiments of the present invention, the source/drain electrodes each include a conductive portion composed of a metal and an organic conductive material layer doped with a dopant. By appropriately selecting the material constituting the organic conductive material layer, good ohmic contacts can be formed between the channel region composed of the organic semiconductor layer and the source/drain electrodes. Since it is not necessary to form the conductive portion using an expensive metal, such as gold, platinum, or palladium, fabrication cost for the field-effect transistors can be reduced. Moreover, since the conductive portion is composed of a metal, high electrical conductivity can be achieved. Since the organic conductive material layer is doped with a dopant, high electrical conductivity can be achieved. Furthermore, resistance between the organic conductive material layer and the conductive portion can be decreased.

Additional features and advantages are described herein, and will be apparent from, the following Detailed Description and the figures.

DETAILED DESCRIPTION

The present invention relates to field-effect transistors (FETs), more particularly, to a field-effect transistor having a channel region composed of an organic semiconductor layer, and still more particularly, to a thin-film transistor (TFT) having a channel region composed of an organic semiconductor layer.

The present invention will now be described based on examples illustrative of various embodiments.

EXAMPLE 1

Example 1 relates to field-effect transistors according to the first and the second embodiments of the present invention.

Figure 1A:
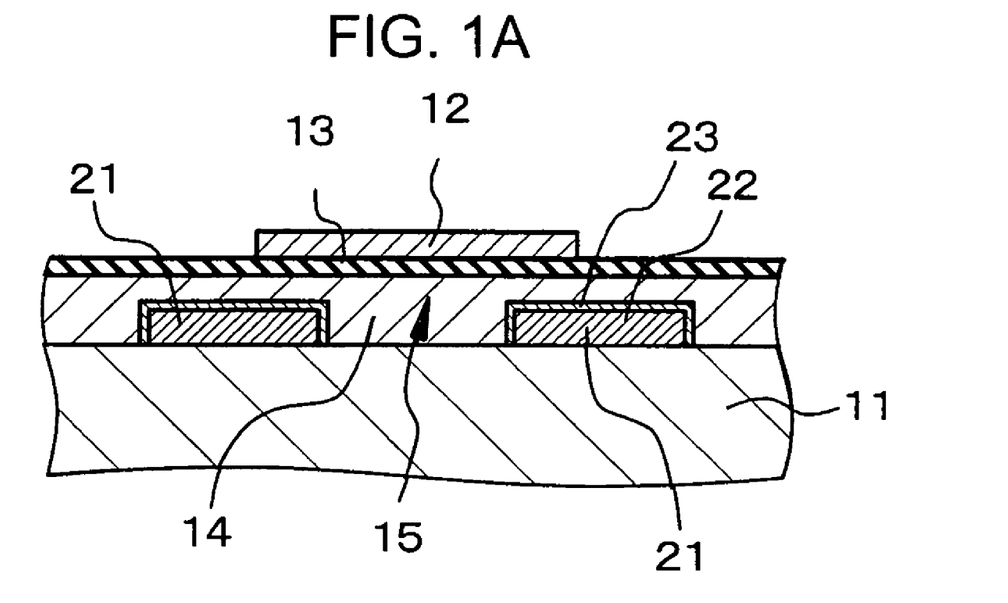
FIG. 1A is a schematic partial sectional view of a field-effect transistor in Example 1.

A field-effect transistor in Example 1, of which schematic partial sectional view is shown in FIG. 1A, includes a gate electrode 12, a gate-insulating layer 13, source/drain electrodes 21, and an organic semiconductor layer 14 constituting a channel region 15. The source/drain electrodes 21 each include a conductive portion 22 composed of a metal and an organic conductive material layer 23 which at least partially covers the conductive portion 22 and which is doped with a dopant.

The channel region 15 is composed of the organic semiconductor layer 14 located between the source/drain electrodes 21. The channel region 15 and each of the conductive portions 22 is electrically connected through the organic conductive material layer 23.

Alternatively, a field-effect transistor in Example 1 is a top gate/bottom contact type TFT and includes (A) source/drain electrodes 21 disposed on a base 11, (B) an organic semiconductor layer 14 disposed on the base 11 located between the source/drain electrodes 21 and on the source/drain electrodes 21, (C) a gate-insulating layer 13 disposed on the organic semiconductor layer 14, and (D) a gate electrode 12 disposed on the gate-insulating layer 13.

The source/drain electrodes 21 each include (a) a conductive portion 22 composed of a metal and (b) an organic conductive material layer 23 doped with a dopant, the organic conductive material layer 23 at least partially covering at least any one of the bottom surface of the conductive portion, a side surface of the conductive portion facing a side surface of the conductive portion constituting the other source/drain electrode, and the top surface of the conductive portion. Specifically, in Example 1, organic conductive material layer 23 is disposed on the surfaces other than the bottom surface of the conductive portion 22. That is, the organic conductive material layer 23 is disposed on the top surface and the facing side surfaces.

In Example 1, the base 11 is a glass substrate provided with a SiO2 layer (not shown) on the surface thereof. The gate electrode 12 is composed of copper (more specifically, an aggregate of fine copper particles). The gate-insulating layer 13 is composed of SiO2. The organic semiconductor layer 14 is composed of pentacene. The metal constituting the conductive portion 22 is copper (more specifically, an aggregate of fine copper particles). Furthermore, the organic conductive material layer 23 is composed of a material obtained by doping an organic material, such as polyethylenedioxythiophene [more precisely, poly(3,4-ethylenedioxythiophene), PEDOT], with a dopant, such as polystyrene sulfonic acid [PSS].

An outline of a method for fabricating the top gate/bottom contact type TFT in Example 1 will be described below.

[Step-100]

First, conductive portions 22 constituting source/drain electrodes 21 are formed on a base 11 by screen printing using copper paste, the base 11 being composed of a glass substrate provided with a SiO2 layer (not shown) on the surface thereof.

[Step-110]

Subsequently, a material obtained by doping polyethylenedioxythiophene with polystyrene sulfonic acid is applied by screen printing so as to cover the conductive portions 22, and thereby organic conductive material layers 23 are formed. Each organic conductive material layer 23 is formed so as to entirely cover the corresponding conductive portion 22.

Alternatively, the material constituting the organic conductive material layer 23 may be a material obtained by doping polyaniline with dodecylbenzenesulfonic acid. Alternatively, the material constituting the organic conductive material layer 23 may be incorporated with carbon nanotubes, fullerenes, or carbon nanotubes and fullerenes. The carbon nanotubes and/or fullerenes are preferably mixed in an amount of 10 parts by weight relative to 100 parts by weight of the material constituting the organic conductive material layer 23.

[Step-120]

Subsequently, an organic semiconductor layer 14 is formed over the entire surface of the work. Specifically, the organic semiconductor layer 14 composed of pentacene is formed by vacuum deposition under the conditions shown in Table 1 below on the source/drain electrodes 21 (more specifically, on the organic conductive material layers 23) and on the base 11. When the organic semiconductor layer 14 is deposited, by partially covering the source/drain electrodes 21 and the base 11, the organic semiconductor layer 14 can be formed without a photolithographic process.

TABLE 1

| Temperature of base | 60° C. |
|---|---|
| Deposition rate | 3 nm/min |
| Pressure | $5 \times 10^{-4}$ Pa |

Alternatively, an organic semiconductor layer 14, for example, composed of polythiophene or polyfluorene may be formed by screen printing or spin coating on the source/drain electrodes 21 (more specifically, on the organic conductive material layers 23) and on the base 11.

[Step-130]

Subsequently, a gate-insulating layer 13 is formed over the entire surface of the work. Specifically, the gate-insulating layer 13 composed of SiO2 is formed by sputtering over the entire surface (specifically, on the organic semiconductor layer 14).

[Step-140]

A gate electrode 12 is then formed on the gate-insulating layer 13 by screen printing using copper paste.

[Step-150]

Finally, an insulating layer (not shown) serving as a passivation film is formed over the entire surface of the work. Openings are formed in the insulating layer above the source/drain electrodes 21, and a wiring material layer is formed on the entire surface including the inside of the openings, followed by patterning of the wiring material layer. Thereby, a field-effect transistor in Example 1 in which wiring (not shown) connected to the source/drain electrodes 21 is formed on the insulating layer is completed.

Figure 1B:
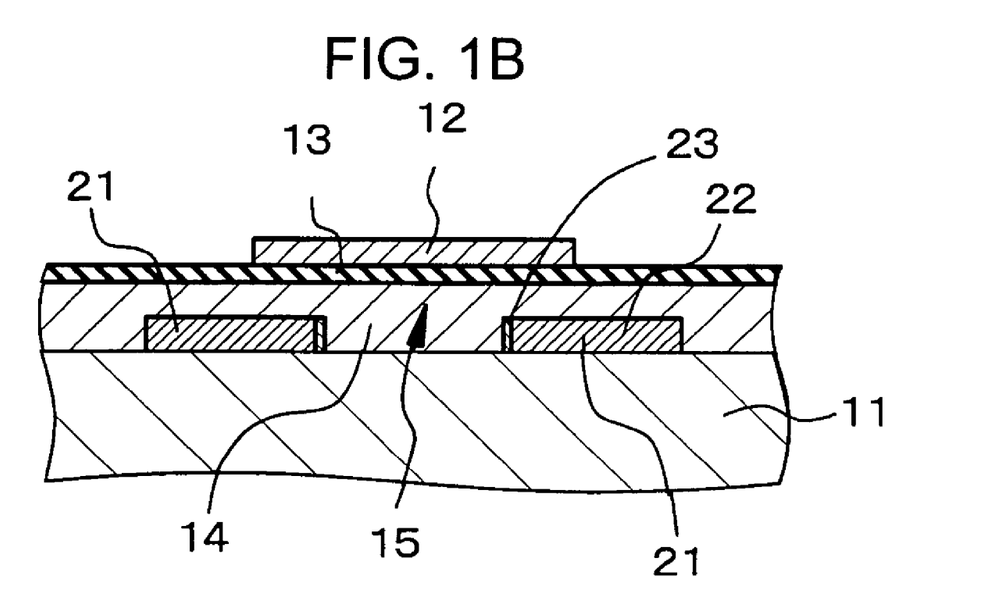
FIG. 1B is a schematic partial sectional view of a variation example of the field-effect transistor in Example 1.
Figure 2A:
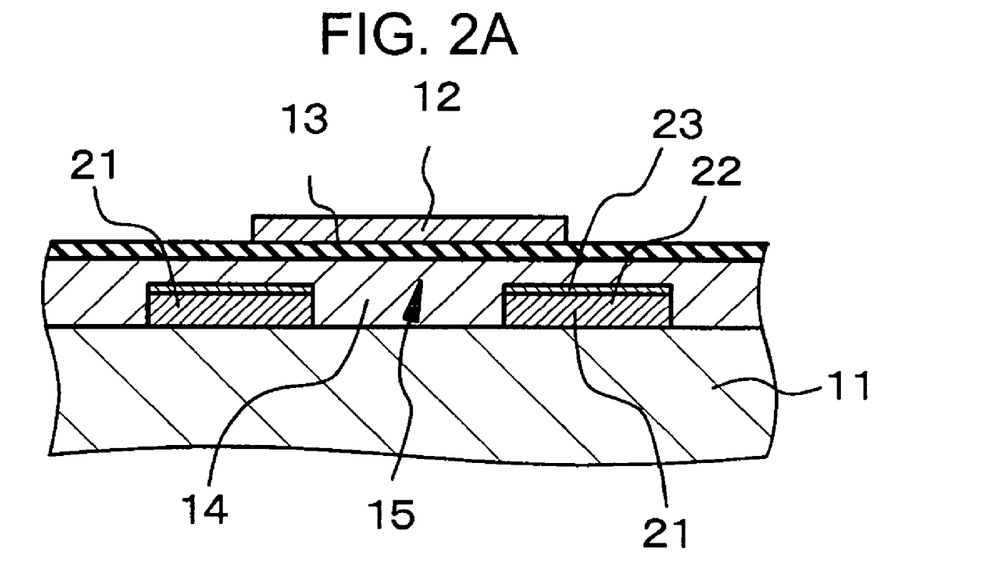
FIG. 2A is a schematic partial sectional view of another variation example of the field-effect transistor in Example 1.
Figure 2B:
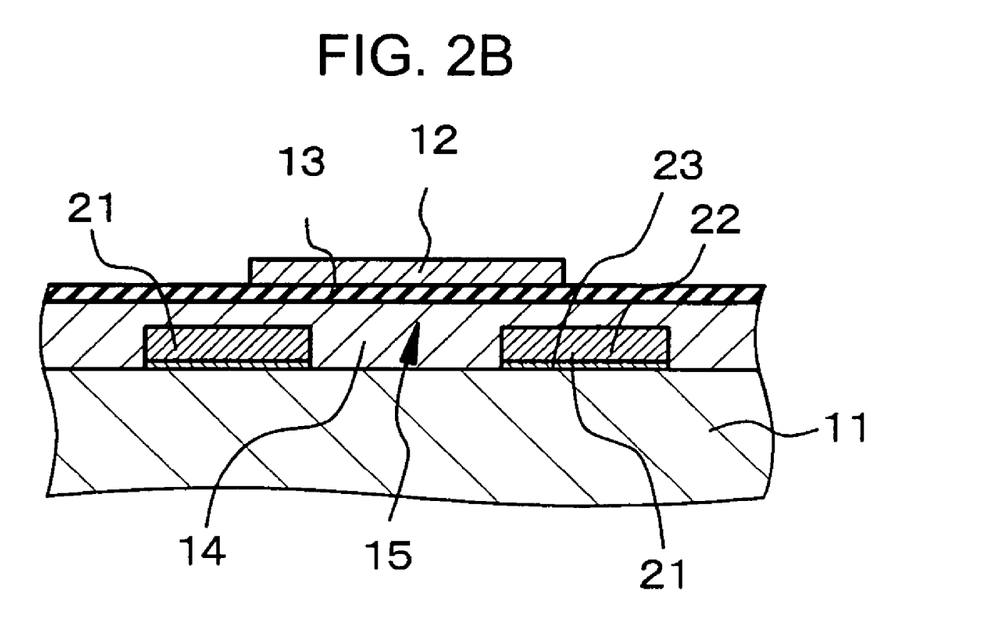
FIG. 2B is a schematic partial sectional view of another variation example of the field-effect transistor in Example 1.

FIGS. 1B, 2A, and 2B each are a schematic partial sectional view of a variation example of the field-effect transistor (top gate/bottom contact type TFT) in Example 1. In the variation example shown in FIG. 1B, the organic conductive material layer 23 is formed on a side surface (facing side surface) of the conductive portion 22 facing a side surface of the conductive portion 22 constituting the other source/drain electrode 21. In the variation example shown in FIG. 2A, the organic conductive material layer 23 is formed on the top surface of the conductive portion 22. Furthermore, in the variation example shown in FIG. 2B, the organic conductive material layer 23 is formed on the bottom surface of the conductive portion 22. Although not shown in the drawing, the organic conductive material layer 23 may be formed on the bottom surface and the facing side surface of the conductive portion 22, or on the top surface, the facing side surface, and the bottom surface of the conductive portion 22. Furthermore, the organic conductive material layer 23 may be formed entirely or partially on each surface. Alternatively, the organic conductive material layer 23 may be formed like an island on each surface.

EXAMPLE 2

Example 2 relates to field-effect transistors according to the first and the third embodiments of the present invention.

Figure 3A:
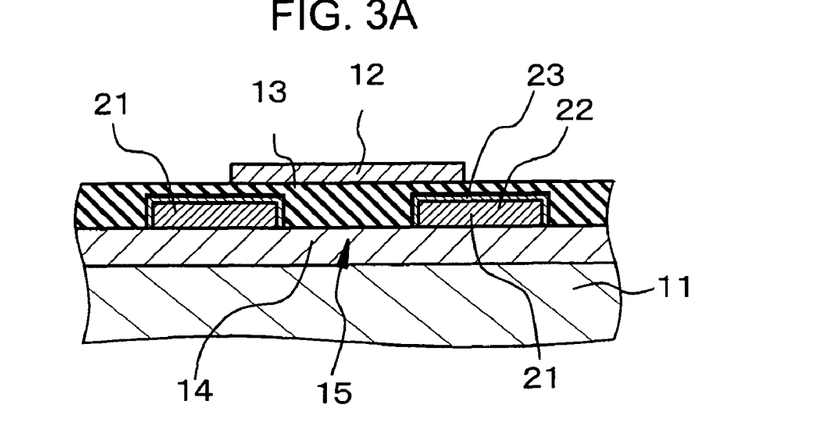
FIG. 3A is a schematic partial sectional view of a field-effect transistor in Example 2.

A field-effect transistor in Example 2, of which schematic partial sectional view is shown in FIG. 3A, includes a gate electrode 12, a gate-insulating layer 13, source/drain electrodes 21, and an organic semiconductor layer 14 constituting a channel region 15. The source/drain electrodes 21 each include a conductive portion 22 composed of a metal and an organic conductive material layer 23 which at least partially covers the conductive portion 22 and which is doped with a dopant.

The channel region 15 is composed of the organic semiconductor layer 14 located between the source/drain electrodes 21. The channel region 15 and each of the conductive portions 22 is electrically connected through the organic conductive material layer 23.

Alternatively, a field-effect transistor in Example 2 is a top gate/top contact type TFT and includes (A) an organic semiconductor layer 14 disposed on a base 11, (B) source/drain electrodes 21 disposed on the organic semiconductor layer 14, (C) a gate-insulating layer 13 disposed on the organic semiconductor layer 14 located between the source/drain electrodes 21 and on the source/drain electrodes 21, and (D) a gate electrode 12 disposed on the gate-insulating layer 13.

The source/drain electrodes 21 each include (a) a conductive portion 22 composed of a metal and (b) an organic conductive material layer 23 doped with a dopant, the organic conductive material layer 23 at least partially covering at least one of the bottom surface of the conductive portion 22 and a side surface of the conductive portion 22 facing a side surface of the conductive portion 22 constituting the other source/drain electrode 21. Specifically, in Example 2, the organic conductive material layer 23 is formed on the surfaces other than the bottom surface. That is, the organic conductive material layer 23 is formed on the facing side surfaces and the top surface of the conductive portion 22.

In Example 2, the base 11, the gate electrode 12, the gate-insulating layer 13, the organic semiconductor layer 14, the metal constituting the conductive portion 22, and the material constituting the organic conductive material layer 23 are composed of the same materials as those described in Example 1.

An outline of a method for fabricating the top gate/top contact type TFT in Example 2 will be described below.

[Step-200]

First, an organic semiconductor layer 14 is formed on a base 11 composed of a glass substrate provided with a SiO2 layer (not shown) on the surface thereof as in [Step-120] in Example 1.

[Step-210]

Subsequently, as in [Step-100] in Example 1, conductive portions 22 constituting source/drain electrodes 21 are formed on the organic semiconductor layer 14 by screen printing using copper paste.

[Step-220]

Subsequently, as in [Step-110] in Example 1, a material obtained by doping an organic material with a dopant is applied by screen printing so as to cover the conductive portions 22, and thereby organic conductive material layers 23 are formed. Each organic conductive material layer 23 is formed so as to entirely cover the corresponding conductive portion 22.

[Step-230]

Subsequently, as in [Step-130] in Example 1, a gate-insulating layer 13 composed of SiO2 is formed by sputtering over the entire surface (specifically, on the organic semiconductor layer 14 and the source/drain electrodes 21).

[Step-240]

A gate electrode 12 is then formed on the gate-insulating layer 13 by screen printing using copper paste.

[Step-250]

Finally, the same step as [Step-150] in Example 1 is carried out. Thereby, a field-effect transistor in Example 2 is completed.

Figure 3B:
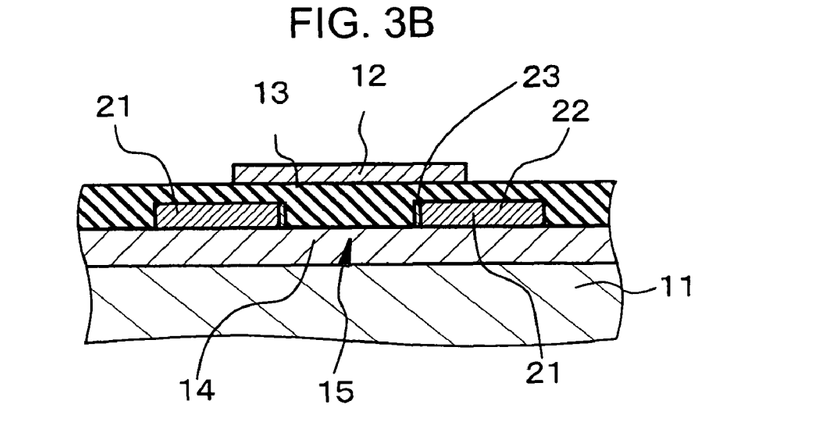
FIG. 3B is a schematic partial sectional view of a variation example of the field-effect transistor in Example 2.
Figure 3C:
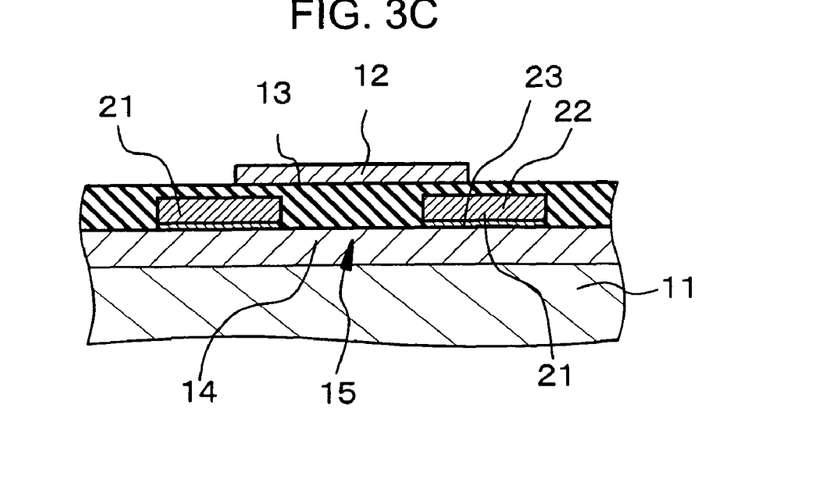
FIG. 3C is a schematic partial sectional view of another variation example of the field-effect transistor in Example 2.

FIGS. 3B and 3C each are a schematic partial sectional view of a variation example of the field-effect transistor (top gate/top contact type TFT) in Example 2. In the variation example shown in FIG. 3B, the organic conductive material layer 23 is formed on a side surface (facing side surface) of the conductive portion 22 facing a side surface of the conductive portion 22 constituting the other source/drain electrode 21. In the variation example shown in FIG. 3(C), the organic conductive material layer 23 is formed on the bottom surface of the conductive portion 22. Although not shown in the drawing, the organic conductive material layer 23 may be formed on the bottom surface and the facing side surface of the conductive portion 22, or on the top surface, the facing side surface, and the bottom surface of the conductive portion 22. Furthermore, the organic conductive material layer 23 may be formed entirely or partially on each surface. Alternatively, the organic conductive material layer 23 may be formed like an island on each surface.

EXAMPLE 3

Example 3 relates to field-effect transistors according to the first and the fourth embodiments of the present invention.

Figure 4A:
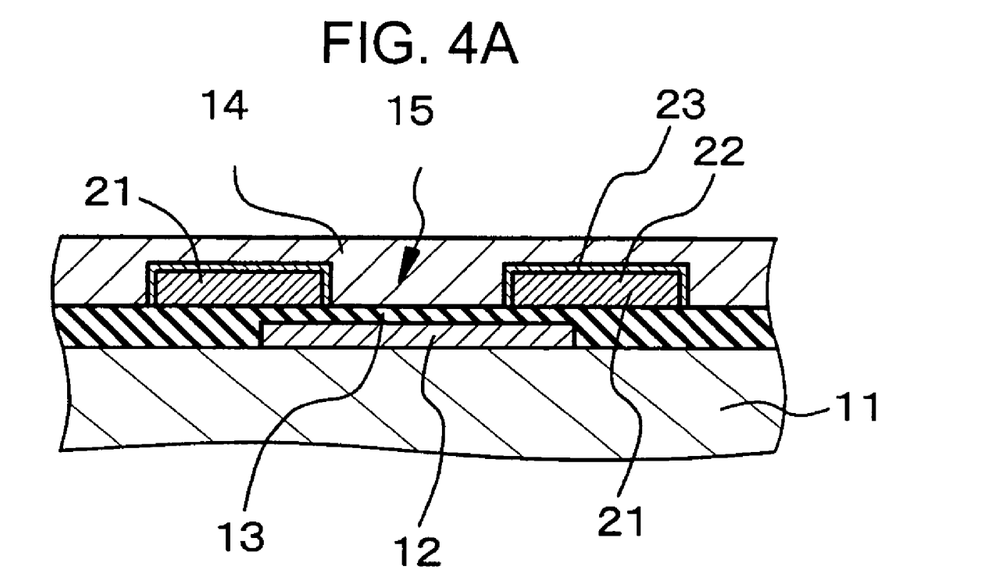
FIG. 4A is a schematic partial sectional view of a field-effect transistor in Example 3.

A field-effect transistor in Example 3, of which schematic partial sectional view is shown in FIG. 4A, includes a gate electrode 12, a gate-insulating layer 13, source/drain electrodes 21, and an organic semiconductor layer 14 constituting a channel region 15. The source/drain electrodes 21 each include a conductive portion 22 composed of a metal and an organic conductive material layer 23 which at least partially covers the conductive portion 22 and which is doped with a dopant.

The channel region 15 is composed of the organic semiconductor layer 14 located between the source/drain electrodes 21. The channel region 15 and each of the conductive portions 22 is electrically connected through the organic conductive material layer 23.

Alternatively, a field-effect transistor in Example 3 is a bottom gate/bottom contact type TFT and includes (A) a gate electrode 12 disposed on a base 11, (B) a gate-insulating layer 13 disposed on the gate electrode 12 and the base 11, (C) source/drain electrodes 21 disposed on the gate-insulating layer 13, and (D) an organic semiconductor layer 14 disposed on the gate-insulating layer 13 located between the source/drain electrodes 21 and on the source/drain electrodes 21.

The source/drain electrodes 21 each include (a) a conductive portion 22 composed of a metal and (b) an organic conductive material layer 23 doped with a dopant, the organic conductive material layer 23 at least partially covering at least one of the bottom surface of the conductive portion 22, a side surface of the conductive portion 22 facing a side surface of the conductive portion 22 constituting the other source/drain electrode 21, and the top surface of the conductive portion 22. Specifically, in Example 3, the organic conductive material layer 23 is formed on the surfaces other than the bottom surface. That is, the organic conductive material layer 23 is formed on the facing side surfaces and the top surface of the conductive portion 22.

In Example 3, the base 11, the gate electrode 12, the gate-insulating layer 13, the organic semiconductor layer 14, the metal constituting the conductive portion 22, and the material constituting the organic conductive material layer 23 are composed of the same materials as those described in Example 1.

An outline of a method for fabricating the bottom gate/bottom contact type TFT in Example 3 will be described below.

[Step-300]

First, a gate electrode 12 is formed, by screen printing using copper paste, on a base 11 composed of a glass substrate provided with a SiO2 layer (not shown) on the surface thereof.

[Step-310]

Subsequently, a gate-insulating layer 13 composed of SiO2 is formed by sputtering on the gate electrode 12 and the base 11.

[Step-320]

Subsequently, as in [Step-100] in Example 1, conductive portions 22 constituting source/drain electrodes 21 are formed on the gate-insulating layer 13 by screen printing using copper paste.

[Step-330]

Subsequently, as in [Step-110] in Example 1, a material obtained by doping an organic material with a dopant is applied by screen printing so as to cover the conductive portions 22, and thereby organic conductive material layers 23 are formed. Each organic conductive material layer 23 is formed so as to entirely cover the corresponding conductive portion 22.

[Step-340]

Subsequently, as in [Step-120] in Example 1, an organic semiconductor layer 14 is formed over the entire surface (specifically, on the source/drain electrodes 21 and on the gate-insulating layer 13).

[Step-350]

Finally, the same step as [Step-150] in Example 1 is carried out. Thereby, a field-effect transistor in Example 3 is completed.

Figure 4B:
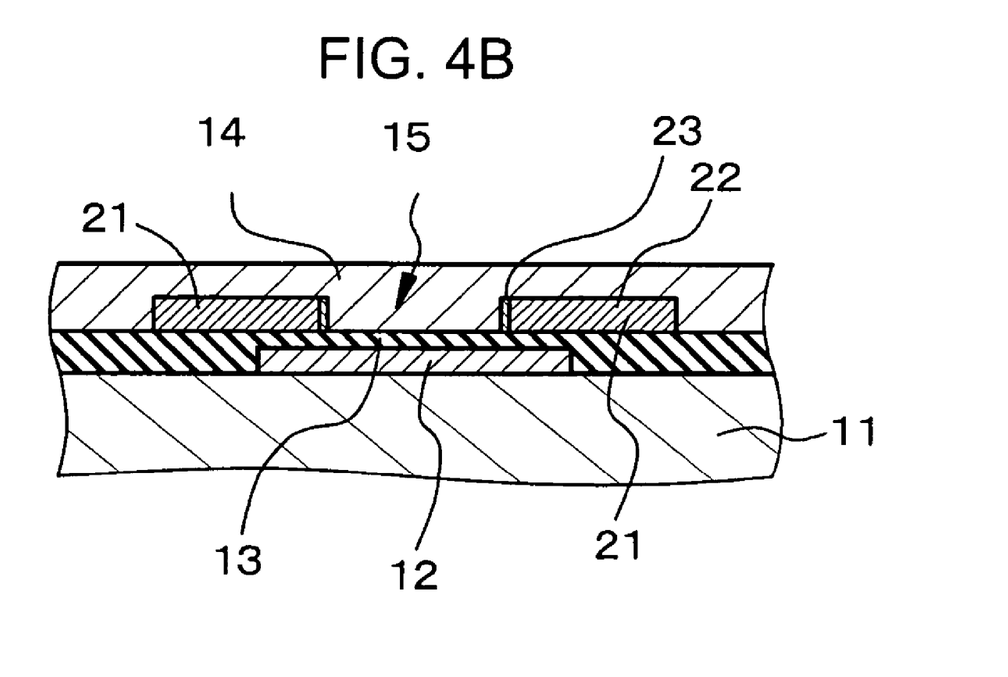
FIG. 4B is a schematic partial sectional view of a variation example of the field-effect transistor in Example 3.
Figure 5A:
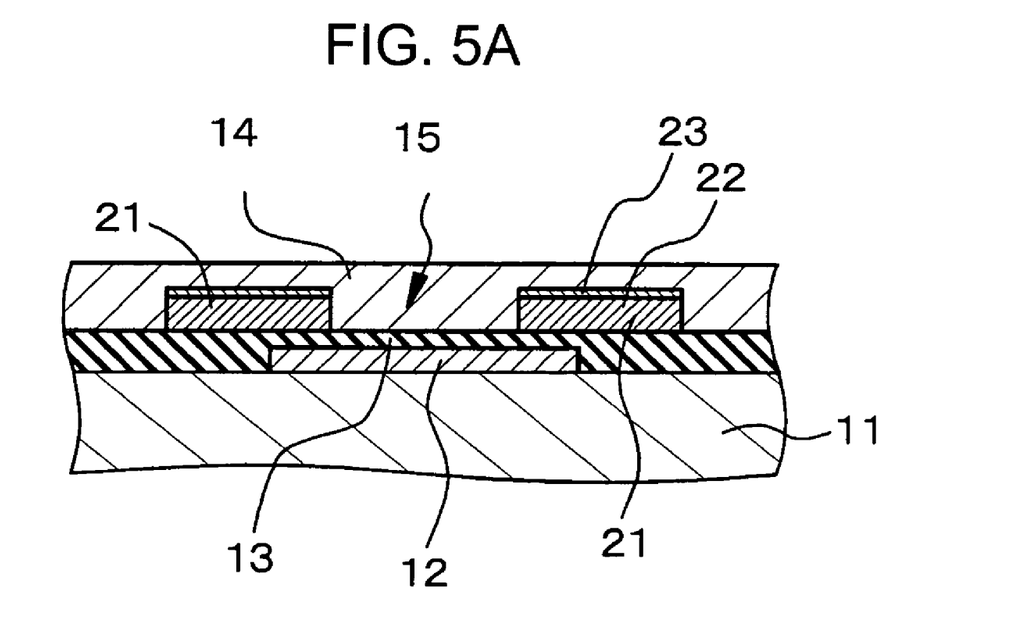
FIG. 5A is a schematic partial sectional view of another variation example of the field-effect transistor in Example 3.
Figure 5B:
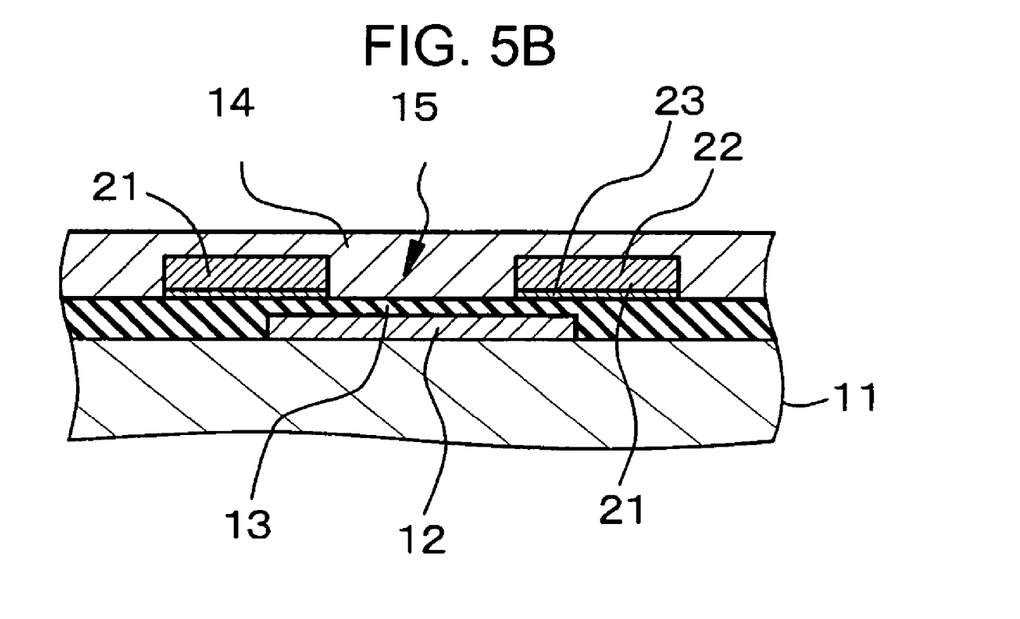
FIG. 5B is a schematic partial sectional view of another variation example of the field-effect transistor in Example 3.

FIGS. 4B, 5A, and 5B each are a schematic partial sectional view of a variation example of the field-effect transistor (bottom gate/bottom contact type TFT) in Example 3. In the variation example shown in FIG. 4B, the organic conductive material layer 23 is formed on a side surface (facing side surface) of the conductive portion 22 facing a side surface of the conductive portion 22 constituting the other source/drain electrode 21. In the variation example shown in FIG. 5A, the organic conductive material layer 23 is formed on the top surface of the conductive portion 22. Furthermore, in the variation example shown in FIG. 5B, the organic conductive material layer 23 is formed on the bottom surface of the conductive portion 22. Although not shown in the drawing, the organic conductive material layer 23 may be formed on the bottom surface and the facing side surface of the conductive portion 22, on the bottom surface and the top surface of the conductive portion 22, or on the top surface, the facing side surface, and the bottom surface of the conductive portion 22. Furthermore, the organic conductive material layer 23 may be formed entirely or partially on each surface. Alternatively, the organic conductive material layer 23 may be formed like an island on each surface.

EXAMPLE 4

Example 4 relates to field-effect transistors according to the first and the fifth embodiments of the present invention.

Figure 6A:
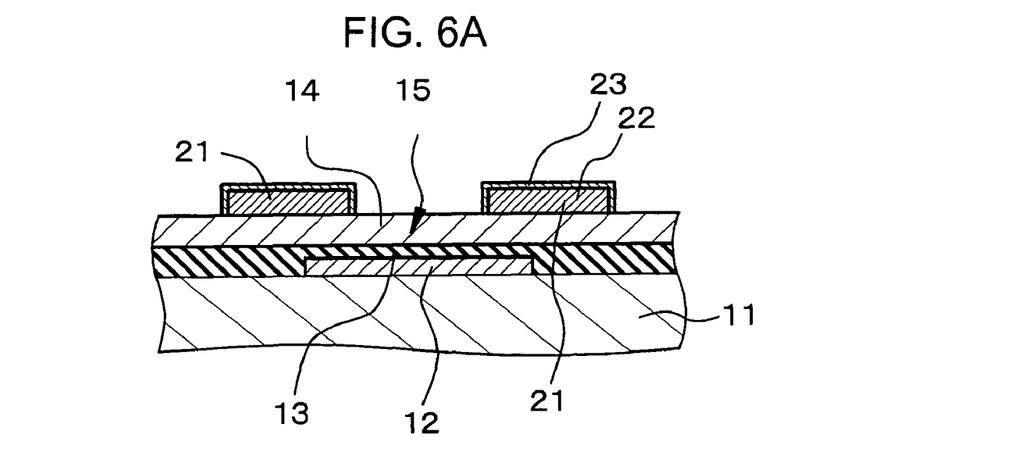
FIG. 6A is a schematic partial sectional view of a field-effect transistor in Example 4.

A field-effect transistor in Example 4, of which schematic partial sectional view is shown in FIG. 6A, includes a gate electrode 12, a gate-insulating layer 13, source/drain electrodes 21, and an organic semiconductor layer 14 constituting a channel region 15. The source/drain electrodes 21 each include a conductive portion 22 composed of a metal and an organic conductive material layer 23 which at least partially covers the conductive portion 22 and which is doped with a dopant.

The channel region 15 is composed of the organic semiconductor layer 14 located between the source/drain electrodes 21. The channel region 15 and each of the conductive portions 22 is electrically connected through the organic conductive material layer 23.

Alternatively, a field-effect transistor in Example 4 is a bottom gate/top contact type TFT and includes (A) a gate electrode 12 disposed on a base 11, (B) a gate-insulating layer 13 disposed on the gate electrode 12 and the base 11, (C) an organic semiconductor layer 14 disposed on the gate-insulating layer 13, and (D) source/drain electrodes 21 disposed on the organic semiconductor layer 14.

The source/drain electrodes 21 each include (a) a conductive portion 22 composed of a metal and (b) an organic conductive material layer 23 doped with a dopant, the organic conductive material layer 23 at least partially covering at least one of the bottom surface of the conductive portion 22 and a side surface of the conductive portion 22 facing a side surface of the conductive portion 22 constituting the other source/drain electrode 21. Specifically, in Example 4, the organic conductive material layer 23 is formed on the surfaces other than the bottom surface. That is, the organic conductive material layer 23 is formed on the facing side surfaces and the top surface of the conductive portion 22.

In Example 4, the base 11, the gate electrode 12, the gate-insulating layer 13, the organic semiconductor layer 14, the metal constituting the conductive portion 22, and the material constituting the organic conductive material layer 23 are composed of the same materials as those described in Example 1.

An outline of a method for fabricating the bottom gate/top contact type TFT in Example 4 will be described below.

[Step-400]

First, a gate electrode 12 is formed, by screen printing using copper paste, on a base 11 composed of a glass substrate provided with a SiO2 layer (not shown) on the surface thereof.

[Step-410]

Subsequently, a gate-insulating layer 13 composed of SiO2 is formed by sputtering on the gate electrode 12 and on the base 11.

[Step-420]

Subsequently, as in [Step-120] in Example 1, an organic semiconductor layer 14 is formed over the entire surface (specifically, on the gate-insulating layer 13).

[Step-430]

Subsequently, as in [Step-100] in Example 1, conductive portions 22 constituting source/drain electrodes 21 are formed on the organic semiconductor layer 14 by screen printing using copper paste.

[Step-440]

Subsequently, as in [Step-110] in Example 1, a material obtained by doping an organic material with a dopant is applied by screen printing so as to cover the conductive portions 22, and thereby organic conductive material layers 23 are formed. Each organic conductive material layer 23 is formed so as to entirely cover the corresponding conductive portion 22.

[Step-450]

Finally, the same step as [Step-150] in Example 1 is carried out. Thereby, a field-effect transistor in Example 4 is completed.

Figure 6B:
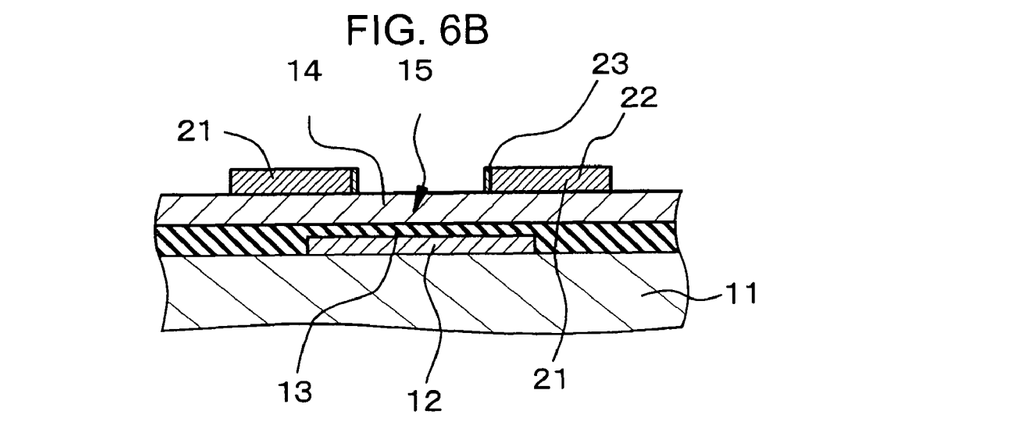
FIG. 6B is a schematic partial sectional view of a variation example of the field-effect transistor in Example 4.
Figure 6C:
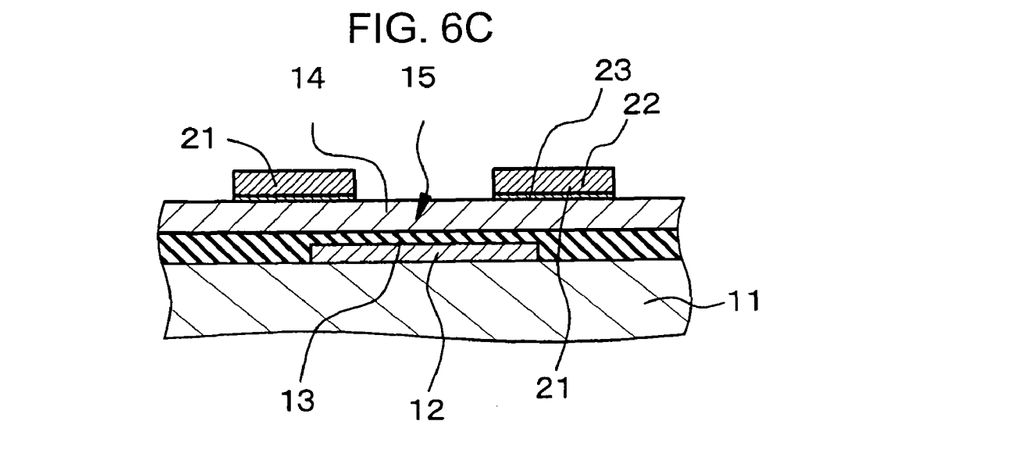
FIG. 6C is a schematic partial sectional view of another variation example of the field-effect transistor in Example 4.

FIGS. 6B and 6C each are a schematic partial sectional view of a variation example of the field-effect transistor (bottom gate/top contact type TFT) in Example 4. In the variation example shown in FIG. 6B, the organic conductive material layer 23 is formed on a side surface (facing side surface) of the conductive portion 22 facing a side surface of the conductive portion 22 constituting the other source/drain electrode 21. In the variation example shown in FIG. 6(C), the organic conductive material layer 23 is formed on the bottom surface of the conductive portion 22. Although not shown in the drawing, the organic conductive material layer 23 may be formed on the bottom surface and the facing side surface of the conductive portion 22, or on the top surface, the facing side surface, and the bottom surface of the conductive portion 22. Furthermore, the organic conductive material layer 23 may be formed entirely or partially on each surface. Alternatively, the organic conductive material layer 23 may be formed like an island on each surface.

The present invention is not limited to the preferred examples described above. The configurations, structures, fabrication conditions, and the materials used for the field-effect transistors in the examples can be appropriately changed. When the field-effect transistors according to the embodiments of the present invention are applied to or used for display devices or various types of electronic apparatuses, monolithic integrated circuits in which many TFTs are integrated on bases or supporting members may be fabricated, or the individual TFTs may be separated by cutting to produce discrete components.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A field-effect transistor comprising:
   a gate electrode;
   a gate-insulating layer;
   source/drain electrodes; and
   an organic semiconductor layer constituting a channel region,
   wherein the source/drain electrodes each include a conductive portion composed of a metal, and an organic conductive material layer which is doped with a dopant, thereby increasing the conductivity of the organic conductive material layer, wherein the channel region includes the organic semiconductor layer located between the source/drain electrodes, wherein the channel region and each of the conductive portions is electrically connected through the organic conductive material layer, and wherein for each source/drain electrode the organic conductive material layer covers any one of:
(a) a side surface of the conductive portion facing another source/drain electrode;
(b) a bottom surface and the side surface of the conductive portion; and
(c) a top surface and the bottom surface of the conductive portion, and wherein for each source/drain electrode at least one of the side surface and the top surface is not covered with the organic conductive material layer.

2. The field-effect transistor according to claim 1, wherein the material constituting the organic conductive material layer is prepared by doping at least one organic material selected from the group consisting of polythiophene, polypyrrole, polyaniline, polyacetylene, polyphenylene, polyfuran, polyselenophene, polyisothianaphthene, polyphenylene sulfide, polyphenylenevinylene, polythienylenevinylene, polynaphthalene, polyanthracene, polypyrene, polyazulene, phthalocyanine, pentacene, merocyanine, and polyethylenedioxythiophene with at least one dopant selected from the group consisting of iodine, perchloric acid, hydrochloric acid, sulfuric acid, nitric acid, phosphoric acid, tetrafluoroboric acid, arsenic pentafluoride, hexafluorophosphoric acid, alkyl sulfonic acid, perfluoroalkyl sulfonic acid, polyacrylic acid, polystyrene sulfonic acid, and dodecylbenzenesulfonic acid.

3. The field-effect transistor according to claim 2, wherein the material constituting the organic conductive material layer contains at least one of carbon nanotubes and fullerenes.

4. The field-effect transistor according to claim 1, wherein a conductivity type of the organic semiconductor layer is the same as a conductivity type of the organic conductive material layer.

5. The field-effect transistor according to claim 1, wherein the metal of the conductive portion is selected from the group consisting of copper, silver, aluminum, fine gold particles, fine platinum particles, and fine palladium particles.

6. A field-effect transistor comprising:
source/drain electrodes disposed on a base;
an organic semiconductor layer disposed on the base located between the source/drain electrodes and on the source/drain electrodes;
a gate-insulating layer disposed on the organic semiconductor layer; and
a gate electrode disposed on the gate-insulating layer,
wherein the source/drain electrodes each include a conductive portion composed of a metal, and an organic conductive material layer doped with a dopant, thereby increasing the conductivity of the organic conductive material layer, and
wherein for each source/drain electrode the organic conductive material layer covers any one of:
(a) a side surface of the conductive portion facing another source/drain electrode;
(b) a bottom surface and the side surface of the conductive portion; and
(c) a top surface and the bottom surface of the conductive portion, and
wherein for each source/drain electrode at least one of the side surface and the top surface is not covered with the organic conductive material layer.

7. The field-effect transistor according to claim 6, wherein the channel region includes the organic semiconductor layer located between the source/drain electrodes, and the channel region and each of the conductive portions is electrically connected through the organic conductive material layer.

8. A field-effect transistor comprising:
an organic semiconductor layer disposed on a base;
source/drain electrodes disposed on the organic semiconductor layer;
a gate-insulating layer disposed on the organic semiconductor layer located between the source/drain electrodes and on the source/drain electrodes; and
a gate electrode disposed on the gate-insulating layer,
wherein the source/drain electrodes each include a conductive portion composed of a metal, and an organic conductive material layer doped with a dopant, thereby increasing the conductivity of the organic conductive material layer, and
wherein for each source/drain electrode the organic conductive material layer covers any one of:
(a) a side surface of the conductive portion facing another source/drain electrode;
(b) a bottom surface and the side surface of the conductive portion; and
(c) a top surface and the bottom surface of the conductive portion, and
wherein for each source/drain electrode at least one of the side surface and the top surface is not covered with the organic conductive material layer.

9. A field-effect transistor comprising:
a gate electrode disposed on a base;
a gate-insulating layer disposed on the gate electrode and the base;
source/drain electrodes disposed on the gate-insulating layer; and
an organic semiconductor layer disposed on the gate-insulating layer located between the source/drain electrodes and on the source/drain electrodes,
wherein the source/drain electrodes each include a conductive portion composed of a metal, and an organic conductive material layer doped with a dopant, thereby increasing the conductivity of the organic conductive material layer, and
wherein for each source/drain electrode the organic conductive material layer covers any one of:
(a) a side surface of the conductive portion facing another source/drain electrode;
(b) a bottom surface and the side surface of the conductive portion; and
(c) a top surface and the bottom surface of the conductive portion, and
wherein for each source/drain electrode at least one of the side surface and the top surface is not covered with the organic conductive material layer.

10. A field-effect transistor comprising:
a gate electrode disposed on a base;
a gate-insulating layer disposed on the gate electrode and the base;
an organic semiconductor layer disposed on the gate-insulating layer; and
source/drain electrodes disposed on the organic semiconductor layer, wherein the source/drain electrodes each include a conductive portion composed of a metal, and an organic conductive material layer doped with a dopant, thereby increasing the conductivity of the organic conductive material layer, and wherein for each source/drain electrode the organic conductive material layer covers any one of:
  (a) a side surface of the conductive portion facing another source/drain electrode;
  (b) a bottom surface and the side surface of the conductive portion; and
  (c) a top surface and the bottom surface of the conductive portion, and wherein for each source/drain electrode at least one of the side surface and the top surface is not covered with the organic conductive material layer.

* * * * *